United States Patent
Chiu et al.

(10) Patent No.: US 10,580,768 B1
(45) Date of Patent: Mar. 3, 2020

(54) GALLIUM ARSENIDE CELL

(71) Applicant: WIN Semiconductors Corp., Tao Yuan (TW)

(72) Inventors: Jui-Chieh Chiu, Taoyuan (TW); Chih-Wen Huang, Taoyuan (TW); Shao-Cheng Hsiao, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 16/145,176

(22) Filed: Sep. 28, 2018

(51) Int. Cl.
*H01L 27/06* (2006.01)
*H03K 19/094* (2006.01)
*H01L 21/02* (2006.01)

(52) U.S. Cl.
CPC .... *H01L 27/0605* (2013.01); *H01L 21/02395* (2013.01); *H03K 19/094* (2013.01)

(58) Field of Classification Search
None
See application file for complete search history.

(56) References Cited

U.S. PATENT DOCUMENTS

| | | | | |
|---|---|---|---|---|
| 5,206,531 A * | 4/1993 | Dandekar | ......... | H01L 29/42316 257/270 |
| 5,358,900 A * | 10/1994 | Suzuki | ............. | H01L 21/28587 257/E21.455 |
| 6,081,006 A * | 6/2000 | Nelson | .................. | H01L 23/481 257/276 |
| 6,201,283 B1 * | 3/2001 | Lai | ...................... | H01L 23/4821 257/410 |
| 8,653,565 B1 * | 2/2014 | Vorhaus | ............. | H01L 21/8252 257/202 |
| 9,653,642 B1 * | 5/2017 | Raring | ................ | H01L 33/0075 |
| 10,128,365 B2 * | 11/2018 | Fayed | ................ | H01L 29/7786 |
| 2005/0116253 A1 * | 6/2005 | Yamane | ............. | H01L 21/8252 257/194 |
| 2009/0128221 A1 * | 5/2009 | Kam | ...................... | B82Y 10/00 327/434 |
| 2015/0102283 A1 | 4/2015 | Matsumoto | | |
| 2016/0056304 A1 * | 2/2016 | Kim | ........................ | H01L 29/78 257/192 |
| 2016/0351668 A1 * | 12/2016 | Schwetlick | ....... | H01L 29/42368 |
| 2017/0040321 A1 * | 2/2017 | Mitard | ............. | H01L 29/78684 |
| 2017/0154989 A1 | 6/2017 | Johnson | | |

(Continued)

FOREIGN PATENT DOCUMENTS

| TW | 280001 | 7/1996 |
|---|---|---|
| TW | 201401512 A | 1/2014 |
| TW | 201409712 A | 3/2014 |

(Continued)

*Primary Examiner* — Crystal L Hammond
(74) *Attorney, Agent, or Firm* — Winston Hsu (57) ABSTRACT

A GaAs (Gallium Arsenide) cell is provided. The GaAs cell comprises at least a GaAs substrates; a plurality of drain electrodes and a plurality of source electrodes, disposed on the at least a GaAs substrates; a gate electrode, disposed between the plurality of drain electrodes and the plurality of source electrodes, elongated along a first direction; a first anchor at a first end of the gate electrode; and a second anchor at a second end of the gate electrode; wherein a gate length of the gate electrode on a second direction is smaller than both a first width of the first anchor and a second width of the second anchor along the second direction.

15 Claims, 9 Drawing Sheets

(56) References Cited

U.S. PATENT DOCUMENTS

2019/0013414 A1* 1/2019 Shu ..................... H01L 29/792

FOREIGN PATENT DOCUMENTS

| TW | 201626747 A | 7/2016 |
| TW | 201724446 A | 7/2017 |
| TW | 201818385 A | 5/2018 |
| WO | 03/009387 A1 | 1/2003 |

* cited by examiner

GALLIUM ARSENIDE CELL

BACKGROUND OF THE INVENTION

1. Field of the Invention

The present invention relates to a GaAs (Gallium Arsenide) cell, and more particularly, to a GaAs cell capable of applying in GaAs logic circuit and reducing circuit area of the GaAs logic circuit.

2. Description of the Prior Art

GaAs (Gallium Arsenide) device has been widely used in MMIC (Monolithic Microwave Integrated Circuit), IR LED (Infrared Ray Light Emitting Diode), FEM (Front End Module), etc. Recently, some simple logic functions have been integrated in GaAs chips. For logic circuits, reducing the circuit area is always an important concern.

On the other hand, as the technology of manufacturing GaAs semiconductor evolves, gate electrodes for HEMT (High Electron Mobility Transistor) may be thin. Since the gate electrode within the HEMT is formed by etching, anchors are included in the HEMT to enhance the stability of the gate electrode. By including the anchors, an area of the GaAs logic circuit is enlarged.

Therefore, how to reduce circuit area for GaAs logic circuit is a significant objective in the field.

SUMMARY OF THE INVENTION

It is therefore a primary objective of the present invention to provide to a GaAs cell capable of applying in GaAs (Gallium Arsenide) logic circuit and reducing circuit area of the GaAs logic circuit, to improve over disadvantages of the prior art.

An embodiment of the present invention discloses a GaAs (Gallium Arsenide) cell, comprising at least a GaAs substrates; a plurality of drain electrodes and a plurality of source electrodes, disposed on the at least a GaAs substrates; a gate electrode, disposed between the plurality of drain electrodes and the plurality of source electrodes, elongated along a first direction; a first anchor at a first end of the gate electrode; and a second anchor at a second end of the gate electrode; wherein a gate length of the gate electrode on a second direction is smaller than both a first width of the first anchor and a second width of the second anchor along the second direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
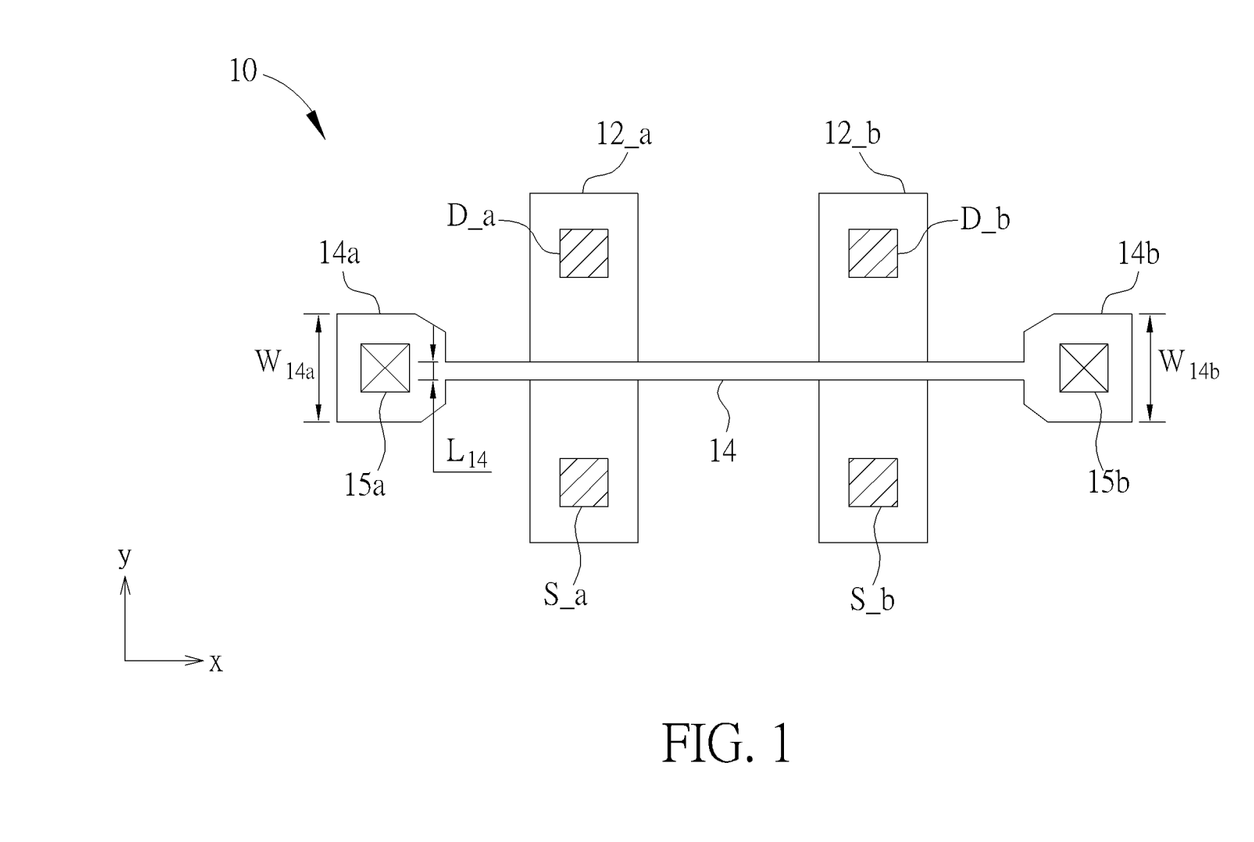
FIG. 1 is a schematic layout diagram of a GaAs (Gallium Arsenide) cell according to an embodiment of the present invention.
Figure 2:
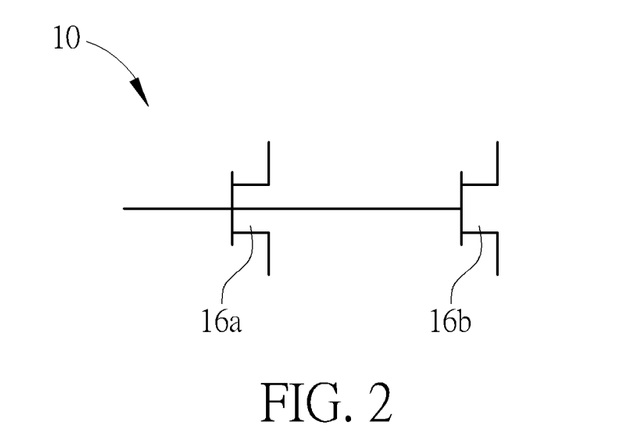
FIG. 2 is a schematic circuit diagram of the GaAs cell of FIG. 1.

Please refer to FIG. 1 and FIG. 2. FIG. 1 is a schematic layout diagram of a GaAs (Gallium Arsenide) cell 10 according to an embodiment of the present invention. FIG. 2 is a schematic circuit diagram of the GaAs cell 10. The GaAs cell 10 comprises GaAs substrates 12_a, 12_b, drain electrodes D_a, D_b, source electrodes S_a, S_b and a gate electrode 14. The drain electrodes D_a, D_b and the source electrodes S_a, S_b are disposed on the GaAs substrates 12_a, 12_b. The gate electrode 14, disposed between the drain electrodes D_a, D_b and the source electrodes S_a, S_b, is elongated along a direction x (or x-axis). The GaAs substrate 12_a, the drain electrode D_a, the source electrodes S_a and the gate electrode 14 form a HEMT (High Electron Mobility Transistor) or a transistor 16a, as FIG. 2 shows, and the GaAs substrate 12_b, the drain electrode D_b, the source electrodes S_b and the gate electrode 14 form a HEMT 16b, as FIG. 2 shows. The GaAs cell 10 is actually a circuit cell comprising two HEMTs (or, equivalently, two transistors) with one single gate.

Notably, as the technology of manufacturing GaAs semiconductor evolves, a gate length $L_{14}$ on a direction y (or y-axis) of the gate electrode 14 can be thin. The thin gate electrodes are able to bring advantages of reducing the circuit area of GaAs device. Different from CMOS manufacturing process, the thin gate electrode 14 is formed by etching, which is fragile. To prevent the gate electrode 14 from fracturing, the GaAs cell 10 further comprises a first anchor 14a and a second anchor 14b, disposed at two ends of the gate electrode 14, i.e., the first anchor 14a is at a first end of the gate electrode 14 and the second anchor 14b is at a second end (of the gate electrode 14). Anchor widths $W_{14a}$ and $W_{14b}$ on the direction y are larger than the gate length $L_{14}$. In an embodiment, the gate length $L_{14}$ of the gate electrode 14 may be 0.5 μm or less than 0.5 μm, and the anchor widths $W_{14a}$ and $W_{14b}$ may be 1 μm or larger than 1 μm.

In addition, sizes of the anchors 14a, 14b should be sufficiently large, and contacts 15a, 15b may be formed on the anchors 14a, 14b, respectively, such that the gate electrode 14 may be coupled to metal lines through the anchors 14a, 14b and the contacts 15a, 15b.

Figure 3:
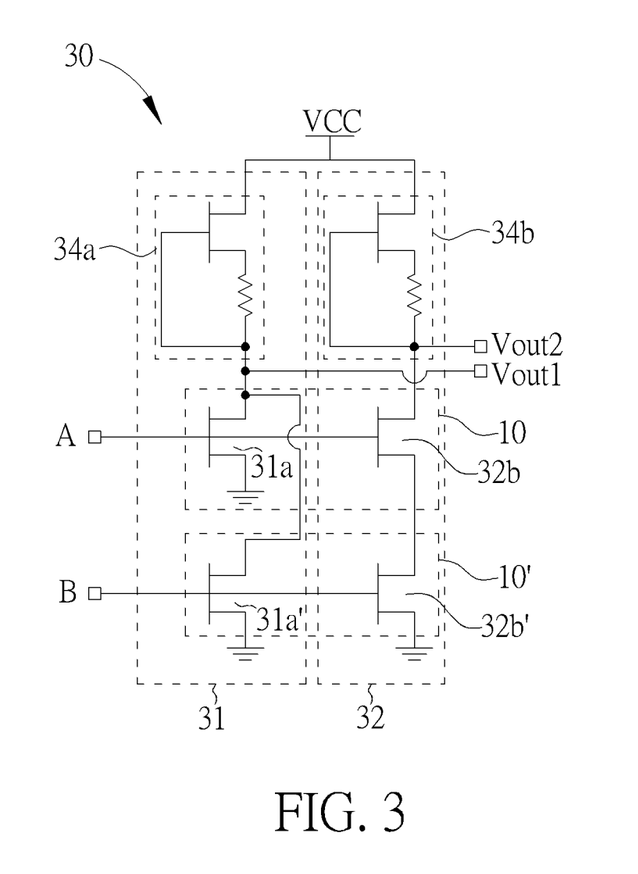
FIG. 3 is a schematic layout diagram of a logic circuit according to an embodiment of the present invention.
Figure 4:
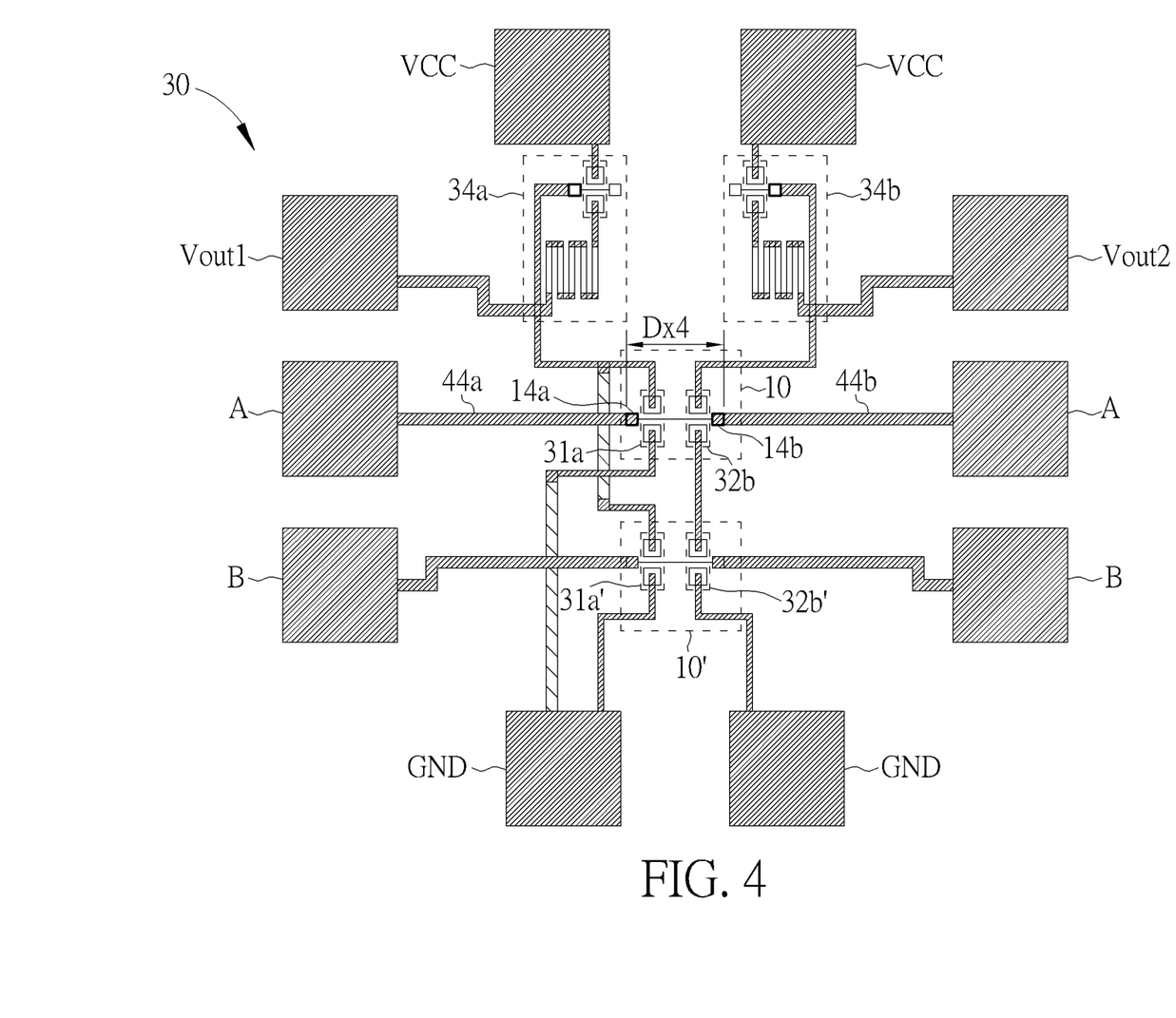
FIG. 4 is a schematic circuit diagram of the logic circuit of FIG. 3.

The GaAs cell 10 may be applied in a logic circuit. Please refer to FIG. 3 and FIG. 4. FIG. 3 is a schematic circuit diagram of a logic circuit 30 according to an embodiment of the present invention. FIG. 4 is a schematic layout diagram of the logic circuit 30. In FIG. 3, the logic circuit 30 comprises a logic sub-circuit 31 and a logic sub-circuit 32. The logic sub-circuit 31 is a realization of a NOR gate preforming a logic NOR function and the logic sub-circuit 32 is a realization of a NAND gate performing a logic NAND function, i.e., the output voltage Vout1 can be expressed as Vout1=A NOR B and the output voltage Vout2 can be expressed as Vout1=A NAND B. The logic sub-circuit 31 comprises transistors 31a and 31a', and the logic sub-circuit 32 comprises transistors 32*b* and 32*b'*. By proper routing of the metal lines, as can be seen from FIG. 4, the transistors 31*a* and 32*b* can be implemented/realized by the GaAs cell 10, and the transistors 31*a'* and 32*b'* can be implemented/realized by a GaAs cell 10', which comprises the same circuit structure as the GaAs cell 10. Note that, the transistor 16*a* in FIG. 2 is the transistor 31*a* in FIG. 3 and FIG. 4, and the transistor 16*b* in FIG. 2 is the transistor 32*b* in FIG. 3 and FIG. 4. In another perspective, the logic circuit 30 may be regarded as comprising the GaAs cells 10 and 10'. The GaAs cells 10 and 10' are connected to each other. The GaAs cell 10' is electrically connected to a ground GND. The GaAs cell 10 is coupled to a positive voltage (supply) VCC through active loads 34*a* and 34*b*. The GaAs cell 10 produces output voltages Vout1 and Vout2.

In the GaAs cell 10, the gate electrode 14 is coupled to the metal line 44*a* to receive a gate signal A corresponding to the logic sub-circuit 31 and coupled to the metal line 44*b* to receive the gate signal A corresponding to the logic sub-circuit 32. The gate electrode 14 is coupled to the metal line 44*a* through the anchor 14*a* and the contact 15*a*, and the gate electrode 14 is coupled to the metal line 44*b* through the anchor 14*b* and the contact 15*b*. In other words, the anchor 14*a* is coupled to the metal line 44*a* through the contact 15*a* to receive the gate signal A corresponding to the logic sub-circuit 31, and the anchor 14*b* is coupled to the metal line 44*b* through the contact 15*b* to receive the gate signal A corresponding to the logic sub-circuit 32.

The anchors 14*a*, 14*b* at the both end of the gate electrode 14 are used to stabilize the thin gate electrode 14, and the contacts 15*a*, 15*b* formed on the anchors 14*a*, 14*b* are used to receive the gate signal A for the different logic sub-circuits 31 and 32. The gate length $L_{14}$ of the gate electrode 14 remains constant between the anchor 14*a* and the anchor 14*b*. In the circuit layout perspective (top view), the gate electrode 14 penetrates through both of the GaAs substrates 12_*a*, 12_*b*. No transition among different metal layers between the anchors 14*a* and 14*b* is established, meaning that no via (s) or contact (s) is disposed on the gate electrode 14, between the anchors 14*a* and 14*b*. Thereby, an area of the GaAs cell 10, especially in the x-axis, is reduced.

Figure 5:
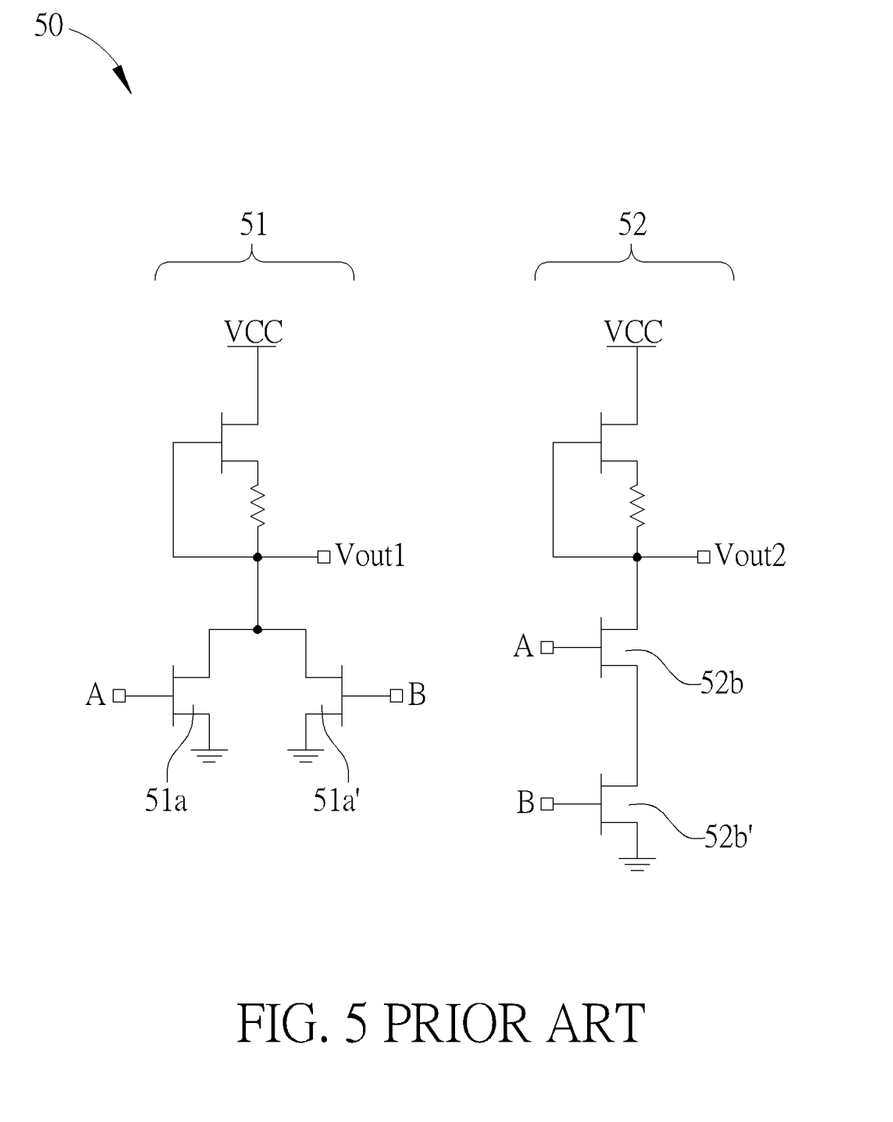
FIG. 5 is a schematic circuit diagram of a logic circuit in the art.
Figure 6:
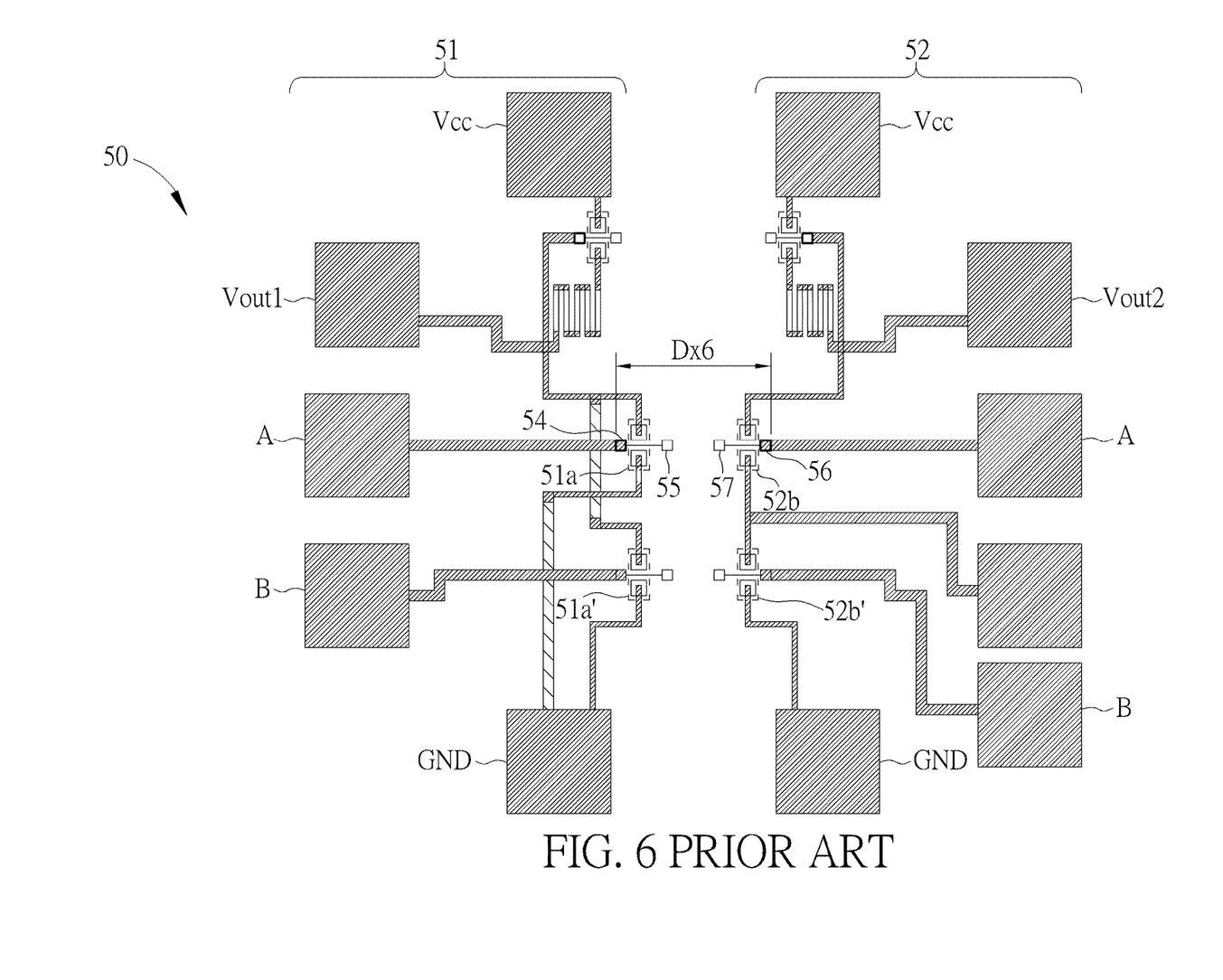
FIG. 6 is a schematic layout diagram of the logic circuit of FIG. 5.

Specifically, please refer to FIG. 5 and FIG. 6. FIG. 5 is a schematic circuit diagram of a logic circuit 50 in the art. FIG. 6 is a schematic layout diagram of the logic circuit 50. The logic circuit 50 may achieve the same logic function as the logic circuit 30. The logic circuit 50 comprises a sub-circuit 51 and a sub-circuit 52. Similar to the sub-circuits 31 and 32, the sub-circuit 51 realizes a NOR gate and the sub-circuit 52 realizes a NAND gate. The sub-circuit 51 comprises transistors 51*a* and 51*a'*, and the sub-circuit 51 comprises transistors 52*b* and 52*b'*.

Taking the schematic layout diagram of the transistors 51*a* and 52*b* (shown in FIG. 6) as an example, to stabilize the gate electrode within the transistor 51*a*, the transistor 51*a* comprises a gate electrode with a large anchor 54 and a small anchor 55. A contact is only formed on the large anchor 54, but not on the small anchor 55, to receive the gate signal A corresponding to the logic sub-circuit 51. Similarly, the transistor 52*b* comprises a gate electrode with a large anchor 56 and a small anchor 57, and a contact is only formed on the large anchor 56, but not on the small anchor 57, to receive the gate signal A corresponding to the logic sub-circuit 52.

In the layout diagram shown in FIG. 6, the transistor 51*a* and the transistor 52*b* are formed individually, meaning that the transistor 51*a*/52*b* comprises individual gate electrodes and small anchor 55/57 without contact formed thereon. The logic circuit 50 occupied more circuit area, in layout perspective, than which of the logic circuit 30, especially in x-axis. Specifically, a distance Dx6 between the anchors 54 and 56 is larger than a distance Dx4 between the anchors 14*a* and 14*b* shown in FIG. 4.

Figure 7:
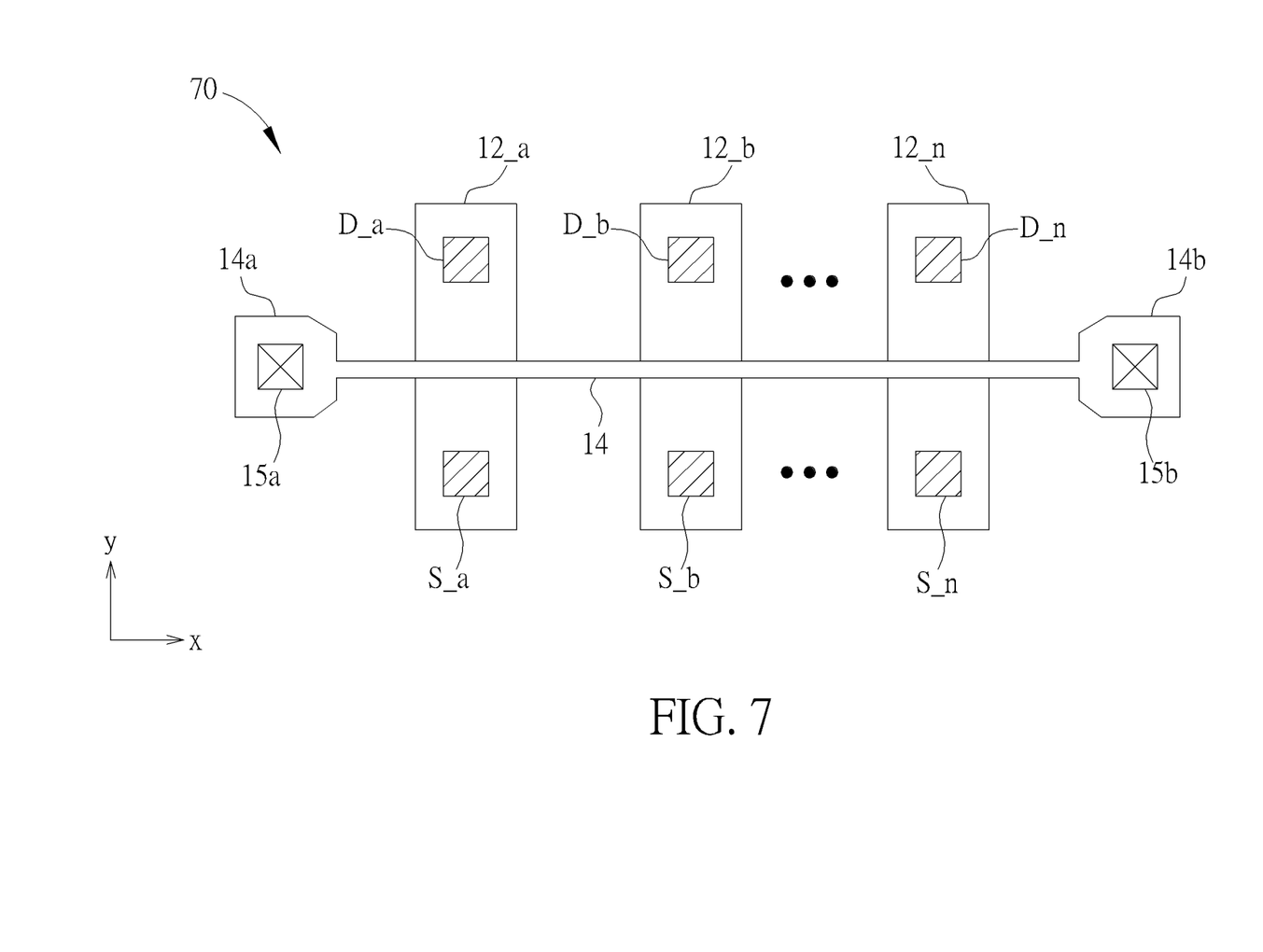
FIG. 7 is a schematic layout diagram of a GaAs cell according to an embodiment of the present invention.

In addition, the GaAs cell may realize multiple transistors with single gate. Please refer to FIG. 7, which is a schematic layout diagram of a GaAs cell 70 according to an embodiment of the present invention. The GaAs cell 70 is similar to the GaAs cell 10, and thus, the same components are denoted by the same notations. Different from the GaAs cell 10 forming two transistors, the GaAs cell 70 forms more than two transistors which receive the same gate signal.

As can be seen from the above, by arranging the transistors receiving the same gate signals, e.g., the transistors 31*a* and 32*b*, together within the logic circuit and utilizing the GaAs cell 10 to implement/realize the transistors receiving the same gate signals, the area/dimension of the logic circuit is reduced.

Notably, the embodiments stated in the above are utilized for illustrating the concept of the present invention. Those skilled in the art may make modifications and alterations accordingly, and not limited herein. For example, in FIG. 3, the GaAs cell 10 is coupled to a positive voltage supply VCC through the active loads 34*a* and 34*b*, which is not limited thereto. The GaAs cell may be coupled to passive load such as TFR (Thin-Film Resistor) or HRT (High Resistance Thin-Film Resistor).

Figure 8:
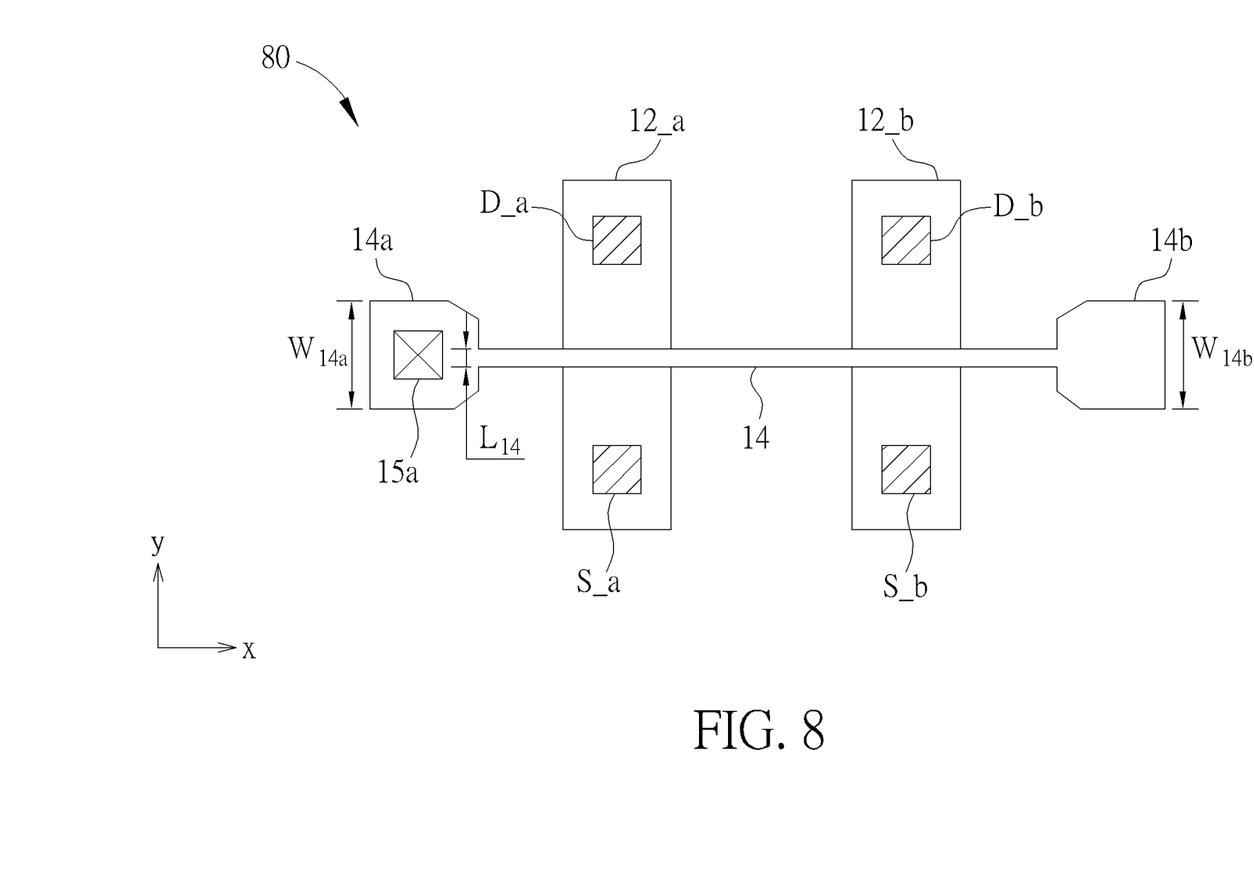
FIG. 8 is a schematic layout diagram of a GaAs cell according to an embodiment of the present invention.

Please refer to FIG. 8. FIG. 8 is a schematic layout diagram of a GaAs cell 80 according to an embodiment of the present invention. The GaAs cell 80 is similar to the GaAs cell 10, and thus, the same components are denoted by the same notations. Different from the GaAs cell 10, there is no contact formed on the anchor 14*b* of the GaAs cell 80.

Figure 9:
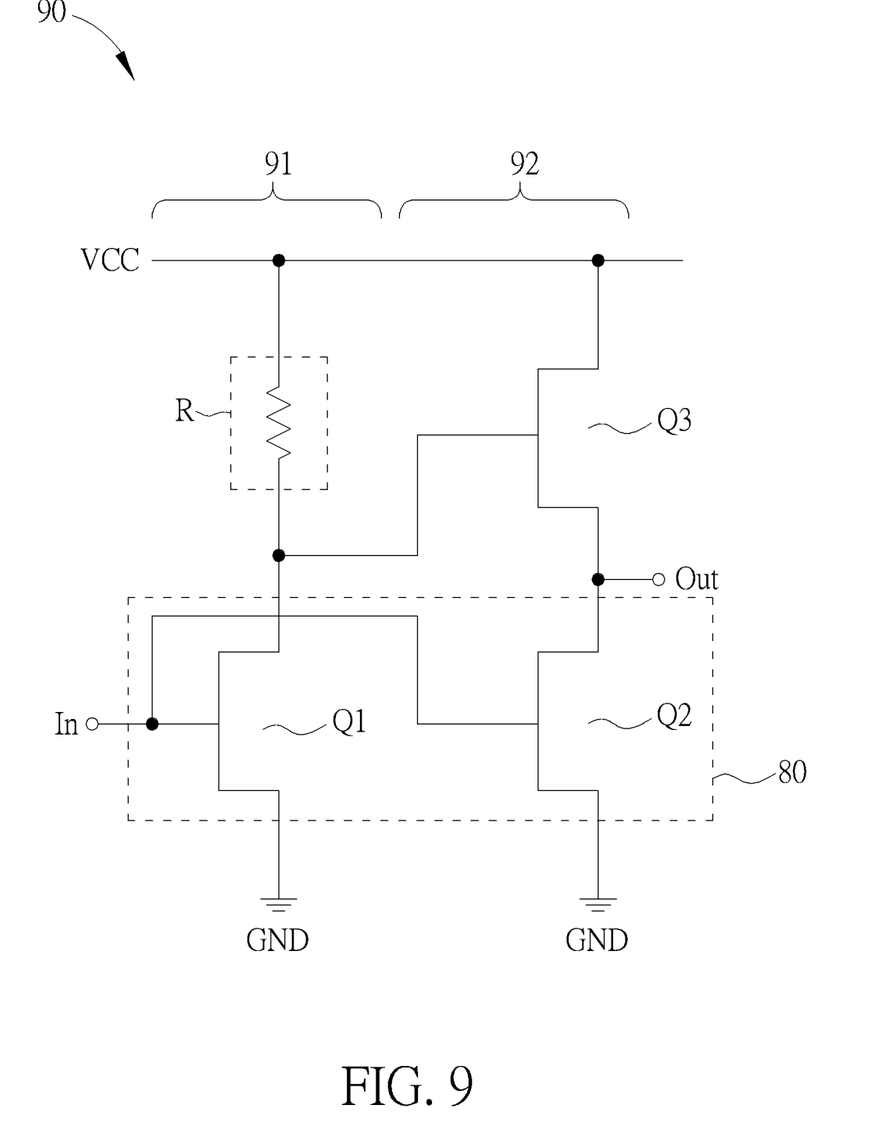
FIG. 9 is a schematic layout diagram of a logic circuit according to an embodiment of the present invention.
Figure 10:
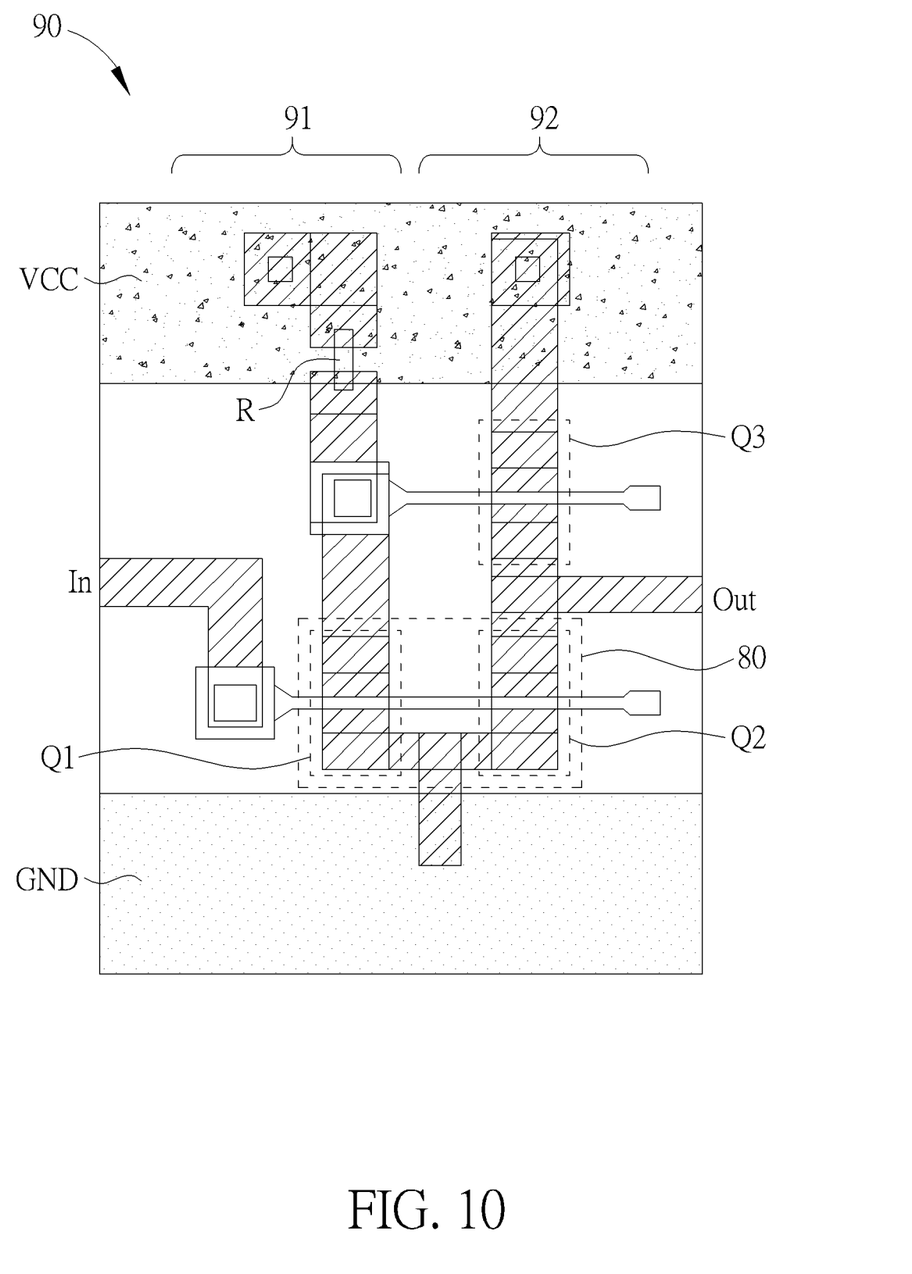
FIG. 10 is a schematic circuit diagram of the logic circuit of FIG. 9.

In an embodiment, the GaAs cell 80 may be applied in a DCFL (Direct Coupled Field Effect Transistor Logic) circuit. Please refer to FIG. 9 and FIG. 10. FIG. 9 is a schematic circuit diagram of a logic circuit 90 according to an embodiment of the present invention. FIG. 10 is a schematic layout diagram of the logic circuit 90. The logic circuit 90 is a DCFL inverter. As can be seen from FIG. 9 and FIG. 10, the logic circuit 90 comprises the GaAs cell 80, a load R and a transistor Q3. The GaAs cell 80 forms transistors Q1 and Q2. The transistor Q2 is coupled to the transistor Q3. The transistor Q1 is coupled to the load R. In the current embodiment, the load R is a passive load realized by a resistor, but not limited thereto. The load R may also be an active load. In a perspective, the transistor Q1 and the load R may form a logic sub-circuit 91, and the transistors Q2 and Q3 may form a buffer sub-circuit 92.

In summary, the present invention utilizes the two large anchors having the two contacts formed thereon and the thin gate electrode to form multiple transistors within the GaAs cell. By arranging multiple transistors, within the logic circuit, receiving the same gate signals in a neighborhood and utilizing the GaAs cell to realize the transistors receiving the same gate signals, the area/dimension of the logic circuit is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A GaAs (Gallium Arsenide) cell, comprising:
   at least a GaAs substrates;

a plurality of drain electrodes and a plurality of source electrodes, disposed on the at least a GaAs substrates;
a gate electrode, disposed between the plurality of drain electrodes and the plurality of source electrodes, elongated along a first direction;
a first anchor at a first end of the gate electrode; and
a second anchor at a second end of the gate electrode, wherein the second anchor is apart from the first anchor;
wherein a gate length of the gate electrode on a second direction is smaller than both a first width of the first anchor and a second width of the second anchor along the second direction;
wherein the plurality of drain electrodes are disposed by a first side of the gate electrode and distributed over the first direction parallel to the gate electrode;
wherein the plurality of source electrodes are disposed by a second side of the gate electrode and distributed over the first direction parallel to the gate electrode;
wherein the first side and the second are opposite at the second direction.

2. The GaAs cell of claim 1, wherein the gate length of the gate electrode remains constant.

3. The GaAs cell of claim 1, wherein the gate length of the gate electrode is less than 0.5 μm.

4. The GaAs cell of claim 1, wherein the gate electrode, the plurality of drain electrodes and the plurality of source electrodes form a plurality of transistors.

5. The GaAs cell of claim 1, wherein a first contact is formed on the first anchor, a second contact is formed on the second anchor, the first anchor is coupled to a first metal line through the first contact to receive a gate signal corresponding to a first sub-circuit, and the second anchor is coupled to a second metal line through the second contact to receive the gate signal corresponding to a second sub-circuit.

6. The GaAs cell of claim 5, wherein the first sub-circuit is configured to perform a first logic function, the second sub-circuit is configured to perform a second logic function.

7. The GaAs cell of claim 5, wherein the first sub-circuit and the second sub-circuit form a logic circuit.

8. The GaAs cell of claim 1, wherein the plurality of drain electrodes are not directly and electrically connected.

9. A logic circuit, comprising:
a plurality of GaAs (Gallium Arsenide) cells, wherein a GaAs cell comprises:
  at least a GaAs substrates;
  a plurality of drain electrodes and a plurality of source electrodes, disposed on the at least a GaAs substrates;
  a gate electrode, disposed between the plurality of drain electrodes and the plurality of source electrodes, elongated along a first direction, wherein the gate electrode, the plurality of drain electrodes and the plurality of source electrodes form a plurality of transistors;
  a first anchor at a first end of the gate electrode; and
  a second anchor at a second end of the gate electrode, wherein the second anchor is apart from the first anchor;
  wherein a gate length of the gate electrode on a second direction is smaller than both a first width of the first anchor and a second width of the second anchor along the second direction;
  wherein the plurality of drain electrodes are disposed by a first side of the gate electrode and distributed over the first direction parallel to the gate electrode;
  wherein the plurality of source electrodes are disposed by a second side of the gate electrode and distributed over the first direction parallel to the gate electrode;
  wherein the first side and the second are opposite at the second direction;
wherein the plurality of GaAs cells are connected to each other, at least one of the gate electrode in GaAs cells receives an input signal, one of transistor in GaAs cells produces an output signal and coupled to a positive voltage supply, and one of transistor in GaAs cells is electrically connected to a ground.

10. The logic circuit of claim 9, wherein at least one of GaAs cell is coupled to the positive voltage supply through at least an active load.

11. The logic circuit of claim 9, wherein at least one of GaAs cell is coupled to the positive voltage supply through at least a passive load.

12. The logic circuit of claim 9, wherein the plurality of drain electrodes are not directly and electrically connected.

13. A logic circuit, comprising:
a GaAs (Gallium Arsenide) cell, comprising:
  at least a GaAs substrates;
  a plurality of drain electrodes and a plurality of source electrodes, disposed on the at least a GaAs substrates;
  a gate electrode, disposed between the plurality of drain electrodes and the plurality of source electrodes, elongated along a first direction, wherein the gate electrode, the plurality of drain electrodes and the plurality of source electrodes form a first transistor and a second transistor;
  a first anchor at a first end of the gate electrode; and
  a second anchor at a second end of the gate electrode, wherein the second anchor is apart from the first anchor;
  wherein a gate length of the gate electrode on a second direction is smaller than both a first width of the first anchor and a second width of the second anchor along the second direction;
  wherein the plurality of drain electrodes are disposed by a first side of the gate electrode and distributed over the first direction parallel to the gate electrode;
  wherein the plurality of source electrodes are disposed by a second side of the gate electrode and distributed over the first direction parallel to the gate electrode;
  wherein the first side and the second are opposite at the second direction;
a load, coupled to the first transistor;
a third transistor, coupled to the second transistor;
wherein the first transistor and the load form a logic sub-circuit;
wherein the second transistor and the third transistor for a buffer sub-circuit.

14. The logic circuit of claim 13, wherein the logic circuit is a DCFL (Direct Coupled Field Effect Transistor Logic) inverter.

15. The logic circuit of claim 13, wherein the plurality of drain electrodes are not directly and electrically connected.

* * * * *